(12) United States Patent
Ni et al.

(10) Patent No.: US 9,985,087 B2
(45) Date of Patent: May 29, 2018

(54) DISPLAY DEVICE WITH PANEL TEST CIRCUIT

(71) Applicant: EverDisplay Optronics (Shanghai) Limited, Shanghai (CN)

(72) Inventors: Jie Ni, Shanghai (CN); Sisi Zhou, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days. days.

(21) Appl. No.: 15/356,222

(22) Filed: Nov. 18, 2016

(65) Prior Publication Data

US 2017/0141181 A1    May 18, 2017

(30) Foreign Application Priority Data

Nov. 18, 2015  (CN) .......................... 2015 1 0799514

(51) Int. Cl.
*H01L 27/32* (2006.01)
*G09G 3/00* (2006.01)

(52) U.S. Cl.
CPC ......... *H01L 27/3279* (2013.01); *G09G 3/006* (2013.01); *H01L 27/326* (2013.01)

(58) Field of Classification Search
None
See application file for complete search history.

(56) References Cited

U.S. PATENT DOCUMENTS

2010/0073009 A1    3/2010 Wang et al.
2014/0354285 A1*  12/2014 Kim ..................... G09G 3/3233
                                                    324/414

FOREIGN PATENT DOCUMENTS

CN        1996443 A      7/2007
CN        100580465 C    1/2010

* cited by examiner

*Primary Examiner* — Jermele M Hollington
(74) *Attorney, Agent, or Firm* — Andrew F. Young, Esq.; Lackenbach Siegel, LLP

(57) ABSTRACT

The present patent application is related to the field of display devices, and provides a display device with panel test circuit the attenuation of data voltage signal could be reduced in the programs of testing pixel array. The display device comprises a plurality of first and second type of bonding pads located on the substrate and around periphery of the pixel array, and the panel test circuit has transistors, the transistors are disposed on the substrate and around periphery of the pixel array, a plurality of data lines of the pixel array are electrically connected with the second type of bonding pads one-to-one, and data detection signal applied to the first type of bonding pads is transmitted to the second type of bonding pads through the panel test circuit.

9 Claims, 3 Drawing Sheets

DISPLAY DEVICE WITH PANEL TEST CIRCUIT

The present application claims priority to and the benefit of Chinese Patent Application No. CN 201510799514.2, filed on Nov. 18, 2015, the entire content of which is incorporated herein by reference.

BACKGROUND OF THE INVENTION

Field of the Invention

The present patent application relates to the field of display devices, more specifically, to a display device with panel test circuit, which can reduce the attenuation of data voltage signal in the programs of testing pixel array.

Description of the Related Art

In the existing method of panel test, the wiring of the panel detection circuit disposed on the edge of the substrate make a detour from the bottom to upward side of the pixel array region to provide a signal, and the resistance of the wiring is very high. Yet, one line of the panel detection circuit may drive a plurality of data lines, such that the resistance capacitance reflects a large negative RC load effect, when the screen can display images in high density, if the input through the data lines is an AC signal, excessive impedance may directly result the panel detection circuit unable to drive the data lines of the pixels array effectively.

For instance, the known China patent application (CN1996443A) has disclosed a display device and test circuit thereof, comprising a pixel array, a front-end circuit, a test circuit, and an enable circuit; the test circuit is used to test the pixel array, the enable circuit decides whether to enable the test circuit according to a certain voltage. When the pixel array has been tested, the constant voltage is provided by the front-end circuit to disable the test circuit. The patent literature decides whether the enable circuit can test the circuit through providing a certain voltage, and after finish test, the constant voltage continues to be provided but the voltage potential is changed, so that the enable circuit presents a disabled state when the display device is in operation. Therefore, the pixel array of the display device disclosed thereof will not be affected by the test circuit and the enable circuit, and result in an abnormal display, and ultimately achieve the purpose of normal operation of the display device, the disclosed literature does not involve in the solution of the problem of the excessive impedance resulted by the over-length wiring of the test circuit.

For instance, the disclosed China patent application (CN100580465C) has disclosed a panel test circuit structure; the panel test circuit comprises a plurality of transmission lines and the display module, the transmission lines connect the display module, each transmission line comprises an input section, a test section, and an output section; the two ends of the test section is respectively in electrical connection with the input section and the output section, one end of the output section is in electrical connection with the display module, and the test signal used by the panel test is input to the test section through a plurality of probes provided by a test circuit substrate, and transmit to the display module through the output section. Therefore, the driver module panels with various architectures, various circuit spans, or various component pin numbers, each can use the same probes and relative test equipments like test circuit substrate to carry out the panel test, also the disclosed literature does not involve in the solution of the problem of the excessive impedance resulted by the over-length wiring of test circuit.

For instance, the disclosed U.S. Patent Application (US2010073009 A1) has disclosed a test circuit adapted in a display panel of an electronic device, which is used for testing the pixel array, the test circuit comprises: a plurality of test signal lines, a plurality of test signal transmitters, a plurality of gate lines and at least one static electricity protection device. The test signal transmitter group comprises a plurality of test signal transmitters corresponding to the test signal lines, each test signal transmitter respectively corresponds to one of the test signal lines, in order to couple to the test signal lines and the pixel array, wherein each test signal transmitter comprises at least one transmission gate; the gate lines couple to the gates of at least one transmission gate; and at least one static electricity protection device couples to two of the gates. Also the disclosed literature does not involve in the solution of the problem of the excessive impedance resulted by the over-length wiring of the test circuit.

SUMMARY OF THE PATENT APPLICATION

In an optional embodiment of the present patent application, a display device with panel test circuit is disclosed, comprising a pixel array disposed on the substrate, and the display device may comprise:
  a plurality of first type of bonding pads, located on the substrate;
  a plurality of second type of bonding pads, located on the substrate; and
  a plurality of first switchers, controlled by a first control signal, and selectively connected between at least one of the plurality of first type of bonding pads and at least one of second type of bonding pads respectively;
  wherein each of the plurality of first switchers comprises a control end configured to receive a first control signal;
  wherein the pixel array comprises a plurality of data lines connected to the plurality of second type of bonding pads in an one-to-one correspondence manner.

Preferably, the display device with panel test circuit as disclosed above, the plurality of first switchers are a plurality of transistors, and each of the plurality of transistors comprises a grid forming the control end.

Preferably, the display device with panel test circuit as disclosed above, the control end is connected to at least one of the plurality of first type of bonding pads, and the first type of bonding pad connected to the control end is configured to receive the first control signal.

Preferably, the display device with panel test circuit as disclosed above, the transistors are all thin-film transistors of PMOS type, and the first control signal is a logic low level in a panel test phase.

Preferably, the display device with panel test circuit as disclosed above, the transistors are thin-film transistors of NMOS type, and the first control signal is in logic high level in the panel test phase.

Preferably, the display device with panel test circuit as disclosed above, the display device further comprises a plurality of second switchers and a plurality of preset switcher groups, and each of the preset switcher groups comprises at least one of the first switchers, and the first and second switchers respectively comprise a control end, a first end, and a second end; wherein
  all the second ends of the first switchers of each preset switcher group are connected to the first end of one of the second switchers, and the first end of each of the first switchers of the preset switcher groups is correspondingly connected to at least one of the second type of bonding pads; and the second end of each of the second switchers is disposed as being connected to at least one of the first type of bonding pads, so that all the second ends of the second switchers all receive a data detection signal transmitted from the first type of bonding pads.

Preferably, the display device with panel test circuit as disclosed above, the control end of each of the second switchers is configured to receive a second control signal; and all the first switchers and the second switchers are simultaneously driven by the second control signal and the first control signal.

Preferably, the display device with panel test circuit as disclosed above, the second switchers are all thin-film transistors of the same type, and the first switchers are all thin-film transistors of the same type.

Preferably, the display device with panel test circuit as disclosed above, the first switchers are thin-film transistors of PMOS type, and the first control signal is logic low level in the panel test phase; or the first switchers are thin-film transistors of NMOS type, and the first control signal is logic high level in the panel test phase.

Preferably, the display device with panel test circuit as disclosed above, the second switchers are thin-film transistors of PMOS type, and the second control signal is logic low level in the panel test phase; or The second switchers are thin-film transistors of NMOS type, and the second control signal is logic high level in the panel test phase.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
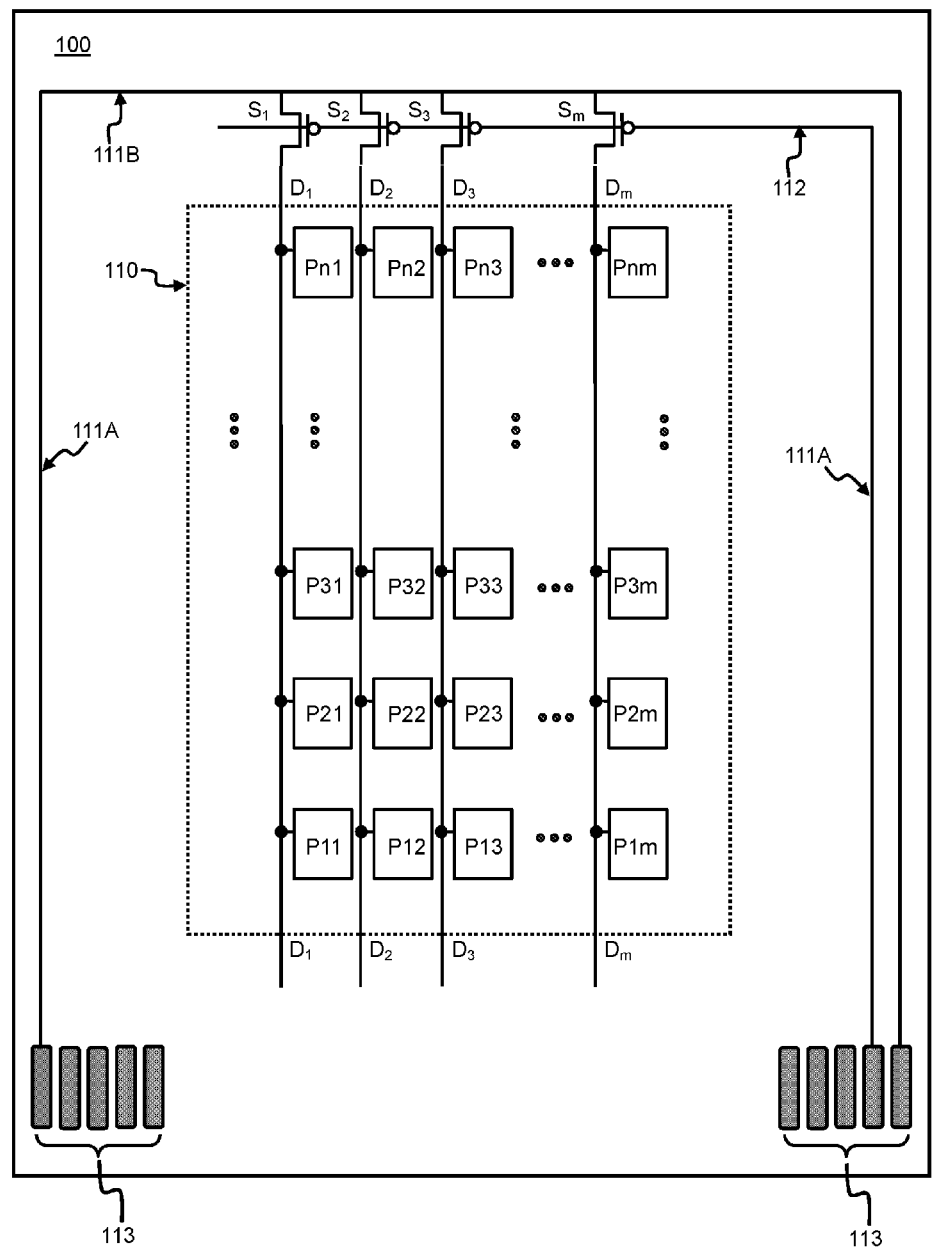
FIG. 1 shows the test method of testing the wiring to make a detour from one side of the substrate to the other side of the pixel array around the edge of the substrate.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Referring to FIG. 1, in the field of panel display, the data line provided by a driver chip or similar equivalent driver element is usually used to cooperatively drive all sub pixel units of a certain column in a pixel array; for example, the first data lines $D_1$ provides a data voltage signal $V_{DATA}$ for all the sub pixel units P11, P21, P31 . . . Pn1 of the first column, the second data lines $D_2$ provides a data voltage signal $V_{DATA}$ for all the sub pixel units P12, P22, P32 . . . Pn2 of the second column, the third data lines $D_3$ provides a data voltage signal $V_{DATA}$ for all the sub pixel units P13, P23, P33 . . . Pn3 of the third column, and so forth, the Mth data lines $D_M$ (M is a natural number greater than 1 herein) provides a data voltage signal $V_{DATA}$ for all the sub pixel units P1m, P2m, P3m . . . Pnm of the Mth column.

In the field of panel display, in order to ensure that the products reached the terminal clients are flawless products, it is necessary to execute a number of electrical detection programs. For example, in present standard test programs of AMOLED, the circuit architectures of the Panel Test and the Array Test commonly used is separate, which manifests on: the Array Test mainly measures the performance of various display elements on the front substrate planted OLED, but the Panel Test measures the performance of various display elements after the substrate is cut into small boards. Generally, the Array Test measures the practical conditions of each of the pixels on each data line, and relatively, the Panel Test measures the conditions of the pixels in the same color (such as pure red or pure green or pure blue). A more serious problem is that with the higher density display image the PPI is getting, since different colors (such as red and green, or blue) existed on one data line, the signal through the data line can embody the essence of carrying a fluctuating signal with AC component, this results that the load of the panel cannot be too large, otherwise the Panel Test will not be able to be driven. Referring to the test proposal shown in FIG. 1, the wiring 111 adapted by the Panel Test programs includes a vertical section 111A and a horizontal section 111B, the two vertical sections 111A thereof are respectively adjacent to the vertical edges of both sides of the substrate 100 and extend vertically along the vertical edge of both sides of the substrate 100, until the wiring 111 makes a detour to the back end of the substrate 100, also namely making the horizontal section 111B provided on the substrate 100 to be located at the back end of the substrate 100.

Referring to FIG. 1, the horizontal section 111B of the wiring 111 is adjacent to a horizontal edge of the back end of the substrate 100 and horizontally extends along the edge, so that the section of the data lines $D_1, D_2 \ldots D_m$ extended to the back end of the substrate 100 can be respectively connected to the horizontal section 111B of the wiring 111 through the switches $S_1, S_2 \ldots S_m$, noting that the switches $S_1, S_2 \ldots S_m$ herein are also disposed at the back end of the substrate 100. The wiring 111 is electrically connected to a number of Panel Test Pads disposed at the front end of the substrate 100, also namely a part of the pads of the first type of bonding pads 1113 below, and the data detection signal $V_{DATA}$ (Data Signal) is input to certain first type of bonding pads 113. In practical test programs, when such switches $S_1, S_2 \ldots S_m$ is in on-state, the data lines $D_1, D_2 \ldots D_m$ can respectively receive the data detection signal $V_{DATA}$ transmitted from the wiring 111. Additionally, the respective control ends of the switches $S_1, S_2 \ldots S_m$ are connected to certain first type of bonding pads 113 through some other wiring 112, therefore the first control signal for driving the switches $S_1, S_2 \ldots S_m$ to switch between on and off is also input to certain first type of bonding pads 113. The trouble of such wiring and testing method is that the detour distance of the wiring 111 is too long, nearly making a detour from the front end of the substrate 100 to the back end of the substrate 100, and the actual impedance induced will be very high.

Figure 2:
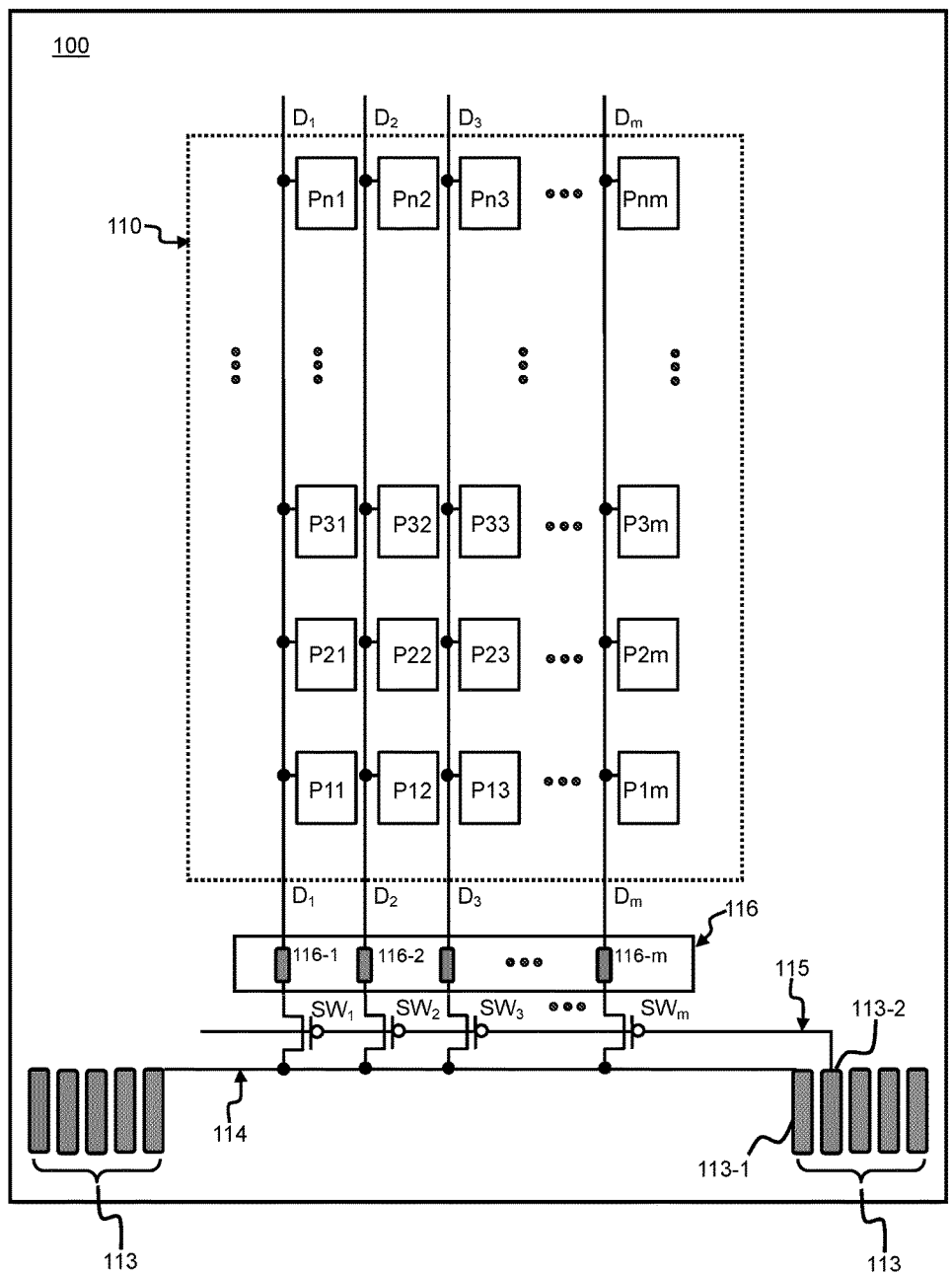
FIG. 2 shows simultaneously configuring the Panel Test and COF Bonding gasket in the front of the pixel array region.

Referring to FIG. 2, comparing to FIG. 1, the original wiring 111 is abandoned; instead of that is using the bonding pads for bonding the I/O ports of the flexible circuit board COF (COF Bonding Pad) to achieve the Panel Test together, and the bonding pads are originally on the substrate 100, also namely the second type of bonding pads 116 designated below, i.e. the switches $S_1, S_2 \ldots S_m$ connected on the first type of bonding pads 113 are respectively connected with the data lines $D_1, D_2 \ldots D_m$ through the corresponding second type of bonding pads 116 above, so that the data detection signal $V_{DATA}$ is provided onto the data lines $D_1, D_2 \ldots D_m$ (the second type of bonding pads 116 do not provide extra signal voltage at this time, the second type of bonding pads are mainly used for the transmission of the data detection signal $V_{DATA}$). The substrate 100 herein can also be a flexible substrate, and the flexible circuit board COF (Chip on Film) herein is mounted with a driver chip IC, the driver IC mounted thereon transmits signal to OLED pixel array through the COF Bonding Pad, and the COF film is a foldable or flexible film, and one end thereof need to be fit onto the substrate 100 to achieve the bonding of the I/O port thereof and the COF Bonding Pad, and the other end thereof is usually connected to the flexible circuit board FPCB. The present application uses the COF Bonding Pad, originally used for signal interaction with the driver IC, and additional test efficacy is endued thereof. Considering the position of the second type of bonding pad 116 is located at the front/end side of the substrate 100, and the aforementioned first type bonding pads 113 for receiving data detection signal $V_{DATA}$ is also located at the front side of the substrate 100, if using the second type of bonding pad to transmit the data detection signal $V_{DATA}$ onto data lines $D_1, D_2 \ldots D_m$ is achieved, and over-length wiring can be avoided, which may be appreciated by the skilled person in the field, and the content of the present patent application below will illustrate how to achieve the purpose.

Referring to FIG. 2, the panel test circuit comprises a series of transistors $SW_1, SW_2 \ldots SW_m$, and the manufacturing time of such thin-film transistors can be synchronously manufactured with the transistors of the pixel array, so that the introduced transistors will not affect the normal standard technological processes. In the optional embodiment, the sum of transistors $SW_1, SW_2 \ldots SW_m$ can be the same as the sum of data lines $D_1, D_2 \ldots D_m$. Each of the transistors $D_1, D_2 \ldots D_m$ has a control end (such as grid), a first end (such as source or drain), and a second end (such as source or drain), the signal applied onto the control end decides whether it is on or off between the first end and the second end of the transistor. Firstly, the first data line $D_1$ is connected to the second type of bonding pad 116-1, the second data line $D_2$ is connected to the second type of bonding pad 116-2, the third data line $D_3$ is connected to the second type of bonding pad 116-3, and so forth, the Nth data line $D_N$ is connected to the second type of bonding pad 116-N. Secondly, the first end of the transistor $SW_1$ is connected to a second type of bonding pad 116-1, the first end of the transistor $SW_2$ is connected to a second type of bonding pad 116-2, the first end of the transistor $SW_3$ is connected to a second type of bonding pad 116-3, and so forth, the first end of the transistor $SW_m$ is connected to a second type of bonding pad 116-m. At the same time, the second end of each transistor of transistors $SW_1, SW_2 \ldots SW_m$ is provided as being connected at least one of a plurality of first type of bonding pads 113, now it just needs to input the data detection signal $V_{DATA}$ to the part of bonding pad 113 connected with the second end of the transistors ($SW_1, SW_2 \ldots SW_m$), the data detection signal $V_{DATA}$ can be transmitted onto the corresponding data line through conducting transistors $SW_1, SW_2 \ldots SW_m$. Additionally, no matter the sum of the transistors and the sum of the data lines are the same or not, the first end of each transistor can be connected with at least one of the second type of bonding pads according to specific demands, namely each transistor may control at least one data line.

Referring to FIG. 2, in an exemplary embodiment, the respective second ends of transistors $SW_1, SW_2 \ldots SW_m$ are simultaneously connected to a wiring 114, and the wiring 114 and the transistors $SW_1, SW_2 \ldots SW_m$ should be equally disposed in the front of the substrate 100 to avoid the excessive impedance, and the wiring 114 is also electrically connected to a first type of bonding pad 113-1. In this optional but not limiting embodiment, the transistors $SW_1, SW_2 \ldots SW_m$ are equivalently to parallel set, and the respective second ends thereof are connected with each other to ensure that the data detection signal $V_{DATA}$ input on the first type of bonding pad 113-1 is simultaneously transmitted to the transistors $SW_1, SW_2 \ldots SW_m$.

Furthermore, each of the control end of the series of transistors $SW_1, SW_2 \ldots SW_m$ should connect to at least one first type of bonding pad 113, and enable all the control ends of the transistors $SW_1, SW_2 \ldots SW_m$ may receive the first control signal CTL1 transmitted from the first type of bonding pads 113. In an exemplary embodiment, the respective control ends of transistors $SW_1, SW_2 \ldots SW_m$ is simultaneously connected to one wiring 115, the wiring 115 should be disposed at the front of the substrate 100 like the transistors $SW_1, SW_2 \ldots SW_m$, and the wiring 115 is electrically connected to one first type of bonding pad 113-2. In this optional but not limiting embodiment, all the transistors are simultaneously driven by the first control signal CTL1 coupled to the first type of bonding pad 113-2. At the phase of panel test, each data line $D_1, D_2 \ldots D_m$ is input the data detection signal $V_{DATA}$ through one of the conducting transistors $SW_1, SW_2 \ldots SW_m$ connected therewith. For example, if the first control signal CTL1 applied to the first type of bonding pad 113-2 drives the transistors $SW_1$, $SW_2 \ldots SW_m$ to be conducting, the first data line $D_1$ is input the expected data detection signal $V_{DATA}$ through the transistor $SW_1$ connected therewith, the second data line $D_2$ is input the expected data detection signal $V_{DATA}$ through the transistor $SW_2$ connected therewith, and so forth, the mth data line $D_m$ is input the expected data detection signal $V_{DATA}$ through the transistor $SW_m$ connected therewith. Since the transistors $SW_1, SW_2 \ldots SW_m$ are simultaneously conducted, and the respective second ends of the transistors $SW_1, SW_2 \ldots SW_m$ are also limited to the potential level of the data detection signal $V_{DATA}$, the pixels of the respective corresponding column of the data lines $D_1, D_2 \ldots D_m$ will be lightened after the first control signal CTL1 controls the transistors $SW_1, SW_2 \ldots SW_m$ to be conducted.

Since the extra manufactured transistors $SW_1, SW_2 \ldots SW_m$ are manufactured together with each of the transistors of the pixel circuit, and PMOS type of thin-film transistors are generally used in each transistor of the pixel circuit, therefore PMOS type of thin-film transistors are preferably used in the transistors $SW_1, SW_2 \ldots SW_m$. Theoretically, there is nothing wrong with the transistors $SW_1, SW_2 \ldots SW_m$ to be NMOS transistors; if they are NMOS, the first control signal CTL1 should be a high level to turn on them, on the contrary, if they are PMOS, the control signal should be a low level so as to turn them on.

Figure 3:
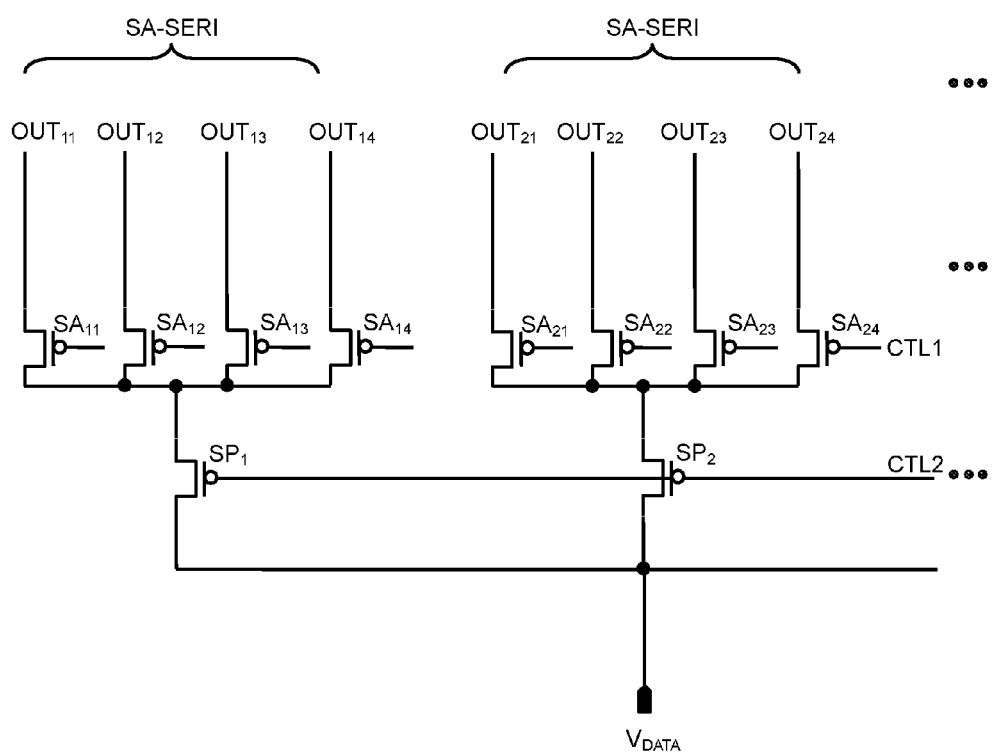
FIG. 3 shows another embodiment of the panel test circuit.

Referring to FIG. 3, it is another optional embodiment, the panel test circuit comprises a plurality of first transistors SP (namely the switch of panel test) and a plurality of preset transistor groups, and each preset transistor group may comprise a plurality of second transistors SA (namely the switch of array test), and the series of transistors SW are replaced by combinatorial topologies thereof, which could realize the same test function. Same as above, the first transistors SP and the second transistors SA are respectively provided control ends (such as grid), and first ends (such as source or drain), and second ends (such as drain or source); also such transistors are used as electrical electronic switches, the control signal applied to control ends thereof is used to decide whether it is on or off between the first ends and second ends of the transistors. Moreover, each preset transistor group comprises a plurality of second transistors, which are more than one; for example, in FIG. 3, the first preset transistor group SA-SERI has a plurality of second transistors ($SA_{11}, SA_{12}, SA_{13}, SA_{14}$), and the second preset transistor group SA-SERI has a plurality of second transistors ($SA_{21}, SA_{22}, SA_{23}, SA_{24}$), . . . and so forth, the Kth preset transistor group SA-SERI has a plurality of second transistors ($SA_{K1}, SA_{K2}, SA_{K3}, SA_{K4}$); note that the K herein is a natural number greater than 1. Relatively, it is also necessary to provide K number of first transistors ($SP_1, SP_2, \ldots SP_K$) to fit with the K number of preset transistor groups SA-SERI.

The matching method of the first preset transistor group SA-SERI and the first transistor $SP_1$ reflects in: the first preset transistor group SA-SERI has a plurality of second transistors ($SA_{11}, SA_{12}, SA_{13}, SA_{14}$), temporarily it is now illustrated with four transistors as an example herein, and the second end of each of the second transistors ($SA_{11}, SA_{12}, SA_{13}, SA_{14}$) is connected with the first end of the first of the first transistor $SP_1$. The second end of the first of the first transistor $SP_1$ can be input the aforementioned data detection signal $V_{DATA}$, so the second end of the first of the first transistor $SP_1$ is disposed as at least being connected to at least one first type of bonding pad 113, for example, being connected to one second type of bonding pad 113-1. Yet, the first end of each second transistor ($SA_{11}, SA_{12}, SA_{13}, SA_{14}$) of the preset transistor group SA-SERI is correspondingly connected to one of a plurality of second type of bonding pads 116; for example, the first end of the second transistor $SA_{11}$ (panel point $OUT_{11}$) is connected to one second type of bonding pad 116-1, the first end of the second transistor $SA_{12}$ (panel point $OUT_{12}$) is connected to one second type of bonding pad 116-2, the first end of the second transistor $SA_{13}$ (panel point $OUT_{13}$) is connected to one second type of bonding pad 116-3, and so forth, the first end of the second transistor $SA_{K4}$ (panel point $OUT_{K4}$) of the Kth preset transistor group SA-SERI is connected to one second type of bonding pad 116-4K.

The matching method of the second preset transistor group SA-SERI and the first transistor $SP_2$ reflects in: the second transistor group preset SA-SERI has a plurality of second transistors ($SA_{21}, SA_{22}, SA_{23}, SA_{24}$); temporarily it is now illustrated with four transistors as an example herein, and the second transistors ($SA_{21}, SA_{22}, SA_{23}, SA_{24}$) is provided as parallel connection so that the second ends of thereof are connected with each other, and the second end of each of the second transistors ($SA_{21}, SA_{22}, SA_{23}, SA_{24}$) is connected with the first end of the second of the first transistor $SP_2$. The second end of the second of first transistor $SP_2$ can be input the aforementioned data detection signal $V_{DATA}$, so the second end of the second of the first transistor $SP_2$ is disposed as being connected to at least one first type of bonding pad 113, for example, being connected to one second type of bonding pad 113-1. Yet the first end of each second transistor ($SA_{21}, SA_{22}, SA_{23}, SA_{24}$) of the preset transistor group SA-SERI is correspondingly connected to one of a plurality of second type of bonding pads 116, for example, the first end of the second transistor $SA_{21}$ (panel point $OUT_{21}$) is connected to one second type of bonding pad 116-5, the first end of the second transistor $SA_{22}$ (panel point $OUT_{22}$) is connected to one second type of bonding pad 116-6, the first end of the second transistor $SA_{23}$ (panel point $OUT_{23}$) is connected to one second type of bonding pad 116-7, and so forth.

The second ends of the first transistors the first transistors $SP_1, SP_2, \ldots SP_K$ is disposed as being connected to at least one first type of bonding pad 113, and make the second ends of all the first transistors $SP_1, SP_2, \ldots SP_K$ can receive the data detection signal $V_{DATA}$ transmitted from the first type of bonding pad 113 connected therewith. Moreover, the control end of each of the first transistors $SP_1, SP_2, \ldots SP_K$ may receive the first control signal CTL1 transmitted from the first type of bonding pad 113. In an exemplary embodiment, the respective control ends of the first transistors $SP_1, SP_2, \ldots SP_K$ are simultaneously connected to one wiring connected with the first type of bonding pad 113-2. In this optional but not limiting embodiment, all the first transistors $SP_1, SP_2, \ldots SP_K$ are simultaneously driven by the second control signal CTL2 coupled to the first type of bonding pad 113-2, the second control signal, for example, is a panel test driving signal Panel Test Signal. Furthermore, the first control signal CTL1 is also provided to be coupled to the respective control ends of all the second transistors {($SA_{11}, SA_{12}, SA_{13}, SA_{14}$), ($SA_{21}, SA_{22}, SA_{23}, SA_{24}$), . . . , ($SA_{K1}, SA_{K2}, SA_{K3}, SA_{K4}$)} of the first transistor group SA-SERI to the Kth transistor group S-SERI, the first control signal CTL1 simultaneously drives all the second transistors, the first control signal, for example, is an array test driving signal Array Test Signal. In addition, the second transistors could directly be the transistors originally exited, which are pre-manufactured for Array Test, the first transistors $SP_1$, $SP_2, \ldots, SP_K$ could directly be the transistors originally exited, which are pre-manufactured for Panel Test.

At the phase of panel test, the first transistors $SP_1$, $SP_2, \ldots SP_K$ are all conducted, and each data line $D_1$, $D_2, \ldots, D_m$ is input the data detection signal $V_{DATA}$ through one second transistor $SA_{21}$, $SA_{22}, \ldots$ in on-state and connected therewith. For example, if the second control signal CTL2 applied to the first type of bonding pad 113-2 drives the first transistors $SP_1, SP_2, \ldots, SP_K$ conducting and the first control signal drives all the second transistors conducting, the first data line $D_1$ is input the data detection signal $V_{DATA}$ expected through the second transistor $SA_{11}$ connected therewith, the second data line $D_2$ is input the data detection signal $V_{DATA}$ expected through the second transistor $SA_{12}$ connected therewith, and so forth, the mth data line $D_m$ is input the data detection signal $V_{DATA}$ expected through the second transistor $SA_{K4}$ connected therewith. Since the first transistors $SP_1, SP_2, \ldots SP_K$ are synchronously conducted, and the second ends thereof are simultaneously limited to the potential level of the data detection signal $V_{DATA}$, so as long as the first control signal CTL1 controls all the second transistors to be conducted, the pixels of respectively corresponding columns of data lines $D_1$, $D_2, \ldots, D_m$ will be lightened. Similarly, the thin-film transistors adapted the same type (such as thin-film transistors of NMOS type or PMOS type) are respectively used to the first transistors and second transistors above preferably, and when thin-film transistors of NMOS type are used to the first transistors, the aforementioned second control signal is a logic high level in the phase of panel test; and when thin-film transistors of PMOS type are used to the first transistors, the aforementioned second control signal is a logic low level in the phase of panel test; relatively, when thin-film transistors of NMOS type are used to the second transistors, the first control signal above is a logic high level at the stage of panel test; and when thin-film transistors of PMOS type are used to the second transistors, the first control signal above is a logic low level at the stage of panel test.

In the content discussed above, to avoid the ambiguity caused by the terms, such term 'at the front side or front end of or in front of the pixel array' on the substrate also could be defined as the first side, or equivalent description; relatively, the relative 'at the back side or back end of the pixel array' on the substrate also can be defined as the second side, or equivalent description. Seeing that the data detection signal or first control signal of the first type of bonding pads is transmitted to the second type of bonding pads through the panel test circuit, therefore each transistor of the panel test circuit is disposed in front of the pixel array, and the control end or first or second end of each transistor and the wiring connected with the first or second type of bonding pads also should be disposed in front of the pixel array to avoid excessive impedance.

In conclusion, the test signal of panel display test enters the active display area from the COF Bonding Pad, which could effectively reduce path resistance of the data detection signal Data, and could more practically reflect the light effect of panel display area, so that the detection rate will remarkably increase and the cost will be preferably saved, and also it avoids that the wiring needs to take a detour to back end area of the substrate opposite to the COF Bonding Pad in display test; because if the impedance of the wiring is too high, the actual light effect of the pixel array cannot be actually reflected when each data line laps over Bonding and inputs data detection signal.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device with panel test circuit, comprising a pixel array disposed on a substrate, wherein, the display device comprises:
   a plurality of first type of bonding pads, located on the substrate;
   a plurality of second type of bonding pads, located on the substrate; and
   a plurality of first switchers controlled by a first control signal, and selectively connected between at least one of the plurality of first type of bonding pads and at least one of the plurality of second type of bonding pads respectively;
   wherein each of the plurality of first switchers comprises a control end configured to receive a first control signal;
   wherein the pixel array comprises a plurality of data lines connected to the plurality of second type of bonding pads in an one-to-one correspondence manner;
   the display device further comprises a plurality of second switchers and a plurality of preset switcher groups, and each of the preset switcher groups comprises at least one of the first switchers, and the first and second switchers respectively comprise a control end, a first end, and a second end; wherein
   all the second ends of the first switchers of each preset switcher group are connected to the first end of one of the second switchers, and the first end of each of the first switchers of the preset switcher groups is correspondingly connected to at least one of the second type of bonding pads; and
   the second end of each of the second switchers is disposed as being connected to at least one of the first type of bonding pads, so that all the second ends of the second switchers all receive a data detection signal transmitted from the first type of bonding pads.

2. The display device with panel test circuit according to claim 1, wherein the plurality of first switchers are a plurality of transistors, and each of the plurality of transistors comprises a grid forming the control end.

3. The display device with panel test circuit according to claim 1, wherein the control end is connected to at least one of the plurality of first type of bonding pads, and the first type of bonding pad connected to the control end is configured to receive the first control signal.

4. The display device with panel test circuit according to claim 2, wherein the transistors are all thin-film transistors of PMOS type, and the first control signal is in logic low level in a panel test phase.

5. The display device with panel test circuit according to claim 2, wherein the transistors are thin-film transistors of NMOS type, and the first control signal is in logic high level in a panel test phase.

6. The display device with panel test circuit according to claim 1, wherein the control end of each of the second switchers is configured to receive a second control signal; and all the first switchers and the second switchers are simultaneously driven by the second control signal and the first control signal.

7. The display device with panel test circuit according to claim 6, wherein the second switchers are all thin-film transistors of same type, and the first switchers are all thin-film transistors of same type.

8. The display device with panel test circuit according to claim 7, wherein the first switchers are thin-film transistors of PMOS type, and the first control signal is in logic low level in the panel test phase; or
the first switchers are thin-film transistors of NMOS type, and the first control signal is in logic high level in the panel test phase.

9. The display device with panel test circuit according to claim 7, wherein the second switchers are thin-film transistors of PMOS type, and the second control signal is in logic low level in a panel test phase; or
the second switchers are thin-film transistors of NMOS type, and the second control signal is in logic high level in a panel test phase.

* * * * *